(12) United States Patent
Wu et al.

(10) Patent No.: US 9,692,293 B2
(45) Date of Patent: Jun. 27, 2017

(54) POWER CONVERSION CIRCUIT HAVING FAULT PROTECTION AND VOLTAGE BALANCE FUNCTIONS

(71) Applicant: General Electric Company, Schenectady, NY (US)

(72) Inventors: Tao Wu, Shanghai (CN); Ying Zhang, Shanghai (CN); Laigui Qin, Shanghai (CN); Yingqi Zhang, Shanghai (CN); Fan Zhang, Shanghai (CN); Xin Hao, Shanghai (CN)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 214 days.

(21) Appl. No.: 14/323,396

(22) Filed: Jul. 3, 2014

(65) Prior Publication Data

US 2015/0009729 A1    Jan. 8, 2015

(30) Foreign Application Priority Data

Jul. 5, 2013   (CN) .......................... 2013 1 0282340

(51) Int. Cl.
    *H02M 1/32*   (2007.01)
    *H02H 7/12*   (2006.01)
    *H03K 17/10*  (2006.01)

(52) U.S. Cl.
    CPC ............ *H02M 1/32* (2013.01); *H02H 7/1203* (2013.01); *H03K 17/107* (2013.01); *H02M 2001/325* (2013.01)

(58) Field of Classification Search
    CPC ...... H02M 1/0007; H02M 1/06; H02M 1/063; H02M 1/32; H02M 1/34; H02M 2001/325;

(Continued)

(56) References Cited

U.S. PATENT DOCUMENTS 4,017,765 A * 4/1977 Maisch ................... F02D 41/20
                                                          361/187
5,324,971 A   6/1994 Notley
(Continued)

FOREIGN PATENT DOCUMENTS

CN    101483334 A    7/2009
WO    2011147423 A1  12/2011

OTHER PUBLICATIONS

European Search Report and Opinion issued in connection with EP Application No. 14175733.6-1806 on Oct. 29, 2014.

(Continued)

*Primary Examiner* — Jeffrey Gblende
*Assistant Examiner* — David A. Singh
(74) *Attorney, Agent, or Firm* — GE Global Patent Operation; Scott R. Stanley

(57) ABSTRACT

A circuit includes a switching module, a control module, and a driving module. The driving module is electrically coupled between the control module and the switching module for generating a driving signal. The driving module includes a normal driving unit and a fault protection unit. The normal driving unit is for turning on and off the switching module according to a first command signal from the control module. The fault protection unit is for lowering the driving signal from a driving value to a protection value according to a second command signal from the control module during a fault protection period after the control module receives a fault signal.

17 Claims, 15 Drawing Sheets

(58) Field of Classification Search
CPC ..... G05F 1/10; G05F 1/46; G05F 1/56; G05F 1/565; G05F 1/569; G05F 1/571; G05F 1/573; G05F 1/5757; G05F 1/59; G05F 1/595; H01C 7/12; H02H 1/0007; H02H 1/06; H02H 1/063; H02H 7/1203; H03K 17/107; G01R 19/16519; G01R 19/16523

USPC .......... 363/13, 50, 52, 53, 55, 56.01, 56.05, 363/56.09, 56.1, 56.11, 56.12; 361/1, 88, 361/91.1, 91.2, 91.5, 91.6, 91.7, 92, 93.1, 361/93.5, 93.7, 93.9

See application file for complete search history.

(56) References Cited

U.S. PATENT DOCUMENTS

| | | | |
|---|---|---|---|
| 5,608,595 A | 3/1997 | Gourab et al. | |
| 5,946,178 A | 8/1999 | Bijlenga | |
| 6,087,877 A | 7/2000 | Gonda et al. | |
| 6,097,582 A | 8/2000 | John et al. | |
| 6,545,452 B2 | 4/2003 | Bruckmann et al. | |
| 6,671,149 B1* | 12/2003 | Chea, Jr. | H04M 3/18 361/87 |
| 7,864,495 B2* | 1/2011 | Ueda | H01L 27/0285 361/58 |
| 8,134,810 B2 | 3/2012 | Maret et al. | |
| 8,354,811 B2 | 1/2013 | Gollentz | |
| 2002/0079944 A1 | 6/2002 | Sander | |
| 2009/0066684 A1* | 3/2009 | Lee | G09G 3/3648 345/211 |
| 2010/0066174 A1 | 3/2010 | Dommaschk et al. | |
| 2011/0249476 A1* | 10/2011 | Chen | H02H 1/0007 363/52 |
| 2012/0075753 A1* | 3/2012 | Watanabe | B60L 15/007 361/18 |
| 2012/0098577 A1 | 4/2012 | Lobsiger et al. | |
| 2012/0230076 A1 | 9/2012 | Palmer et al. | |
| 2013/0083576 A1* | 4/2013 | Gan | H02M 1/088 363/123 |
| 2014/0085762 A1* | 3/2014 | Shimano | H02M 1/08 361/91.6 |
| 2014/0160802 A1* | 6/2014 | Zhang | H02M 3/335 363/21.01 |
| 2014/0285935 A1* | 9/2014 | Tsai | H02H 3/10 361/86 |

OTHER PUBLICATIONS

Consoli et al., "Active Voltage Balancement of Series Connected IGBTs", Industry Applications Conference, 1995. Thirtieth IAS Annual Meeting, IAS '95., Conference Record of the 1995 IEEE,Issue Date—Oct. 8-12, 1995, vol. 3 pp. 2752- 2758, ISSN : 0197-2618.

Zhi-Ming et al., "A Research of IGCT High Voltage Power Converter", Volume No. 41, Issue No. 10, pp. 1674-1678, Oct. 31, 2007.

Chinese office action issued in connection with corresponding CN Application No. 201310282340.3 on Sep. 1, 2016.

* cited by examiner

POWER CONVERSION CIRCUIT HAVING FAULT PROTECTION AND VOLTAGE BALANCE FUNCTIONS

BACKGROUND

This invention related to a circuit, especially related to a circuit for safely turning off an electronic switch when fault happens.

A converter is widely used in a power converting circuit for converting electrical power from the power source to the electrical power to the load. For example, an inverter can convert a DC power to an AC power for providing to an AC load. A rectifier can convert an AC power to a DC power for providing to a DC load. A DC/DC converter can convert a DC power to another DC power. Generally, the converters include multiple switching modules. Power converting process can be achieved by turning on and off the switching modules by a suitable control system. For some power converting system with a request of high voltage such as high voltage pump, high voltage compressor, etc., a current with a high voltage will flow through each switching branch. Typically, the switching modules in each switching branch include thyristors such as Insulated Gate Bipolar Transistor (IGBT). Under some circumstances, if only a switch is used in each switching branch, the IGBT is not able to bear the high voltage. In order to avoid the damage to the switch, at least two IGBTs are coupled in series in the switching branch to share the high voltage and a synchronous control is implemented. When fault (e.g., a short circuit fault) occurs, the IGBT(s) is needed to be turned off and an over voltage caused by a quick change of the current may damage the IGBT(s). After the occurrence of the short circuit fault, a serious problem of voltage imbalance will exist when turning off the at least two IGBTs and even damage at least one of the IGBTs which bears a higher turn-off voltage. Considering the characteristics of IGBT and the accuracy of the control system, conventional short circuit protection method usually cost a lot of money or using a corresponding complex circuit.

Therefore, a new low-cost and simple circuit is needed to solve the above problems.

BRIEF DESCRIPTION

In accordance with an embodiment of the invention, a circuit is provided. The circuit includes a switching module, a control module, and a driving module. The driving module is electrically coupled between the control module and the switching module for generating a driving signal. The driving module includes a normal driving unit and a fault protection unit. The normal driving unit is for turning on and off the switching module according to a first command signal from the control module. The fault protection unit is for lowering the driving signal from a driving value to a protection value according to a second command signal from the control module during a fault protection period after the control module receives a fault signal.

In accordance with another embodiment of the invention, a power conversion circuit is provided. The power conversion circuit includes a control module and a converter. The converter is for converting a first power to a second power. The converter includes a switching module and a driving module. The driving module is electrically coupled between the control module and the switching module for generating a driving signal. The driving module includes a normal driving unit and a fault protection unit. The normal driving unit is for turning on and off the switching module according to a first command signal from the control module. The fault protection unit is for lowering the driving signal from a driving value to a protection value according to a second command signal from the control module during a fault protection period after the control module receives a fault signal.

In accordance with another embodiment of the invention, a circuit is provided. The circuit includes a control module, a switching module and a driving module. The driving module is electrically coupled between the control module and the switching module for generating a driving signal. The driving module includes turning on and off the switching module according to a first command signal from the control module. During a fault protection period, the driving module is for lowering the driving signal from a driving value to a protection value according to a second command signal from the control module after the control module receives a fault signal. After the fault protection period, the driving module is for providing the driving signal having a breaking value to the switching module to turn off the switching module.

DRAWINGS

These and other features, aspects, and advantages of the present invention will become better understood when the following detailed description is read with reference to the accompanying drawings in which like characters represent like parts throughout the drawings, wherein.

Figure 1:
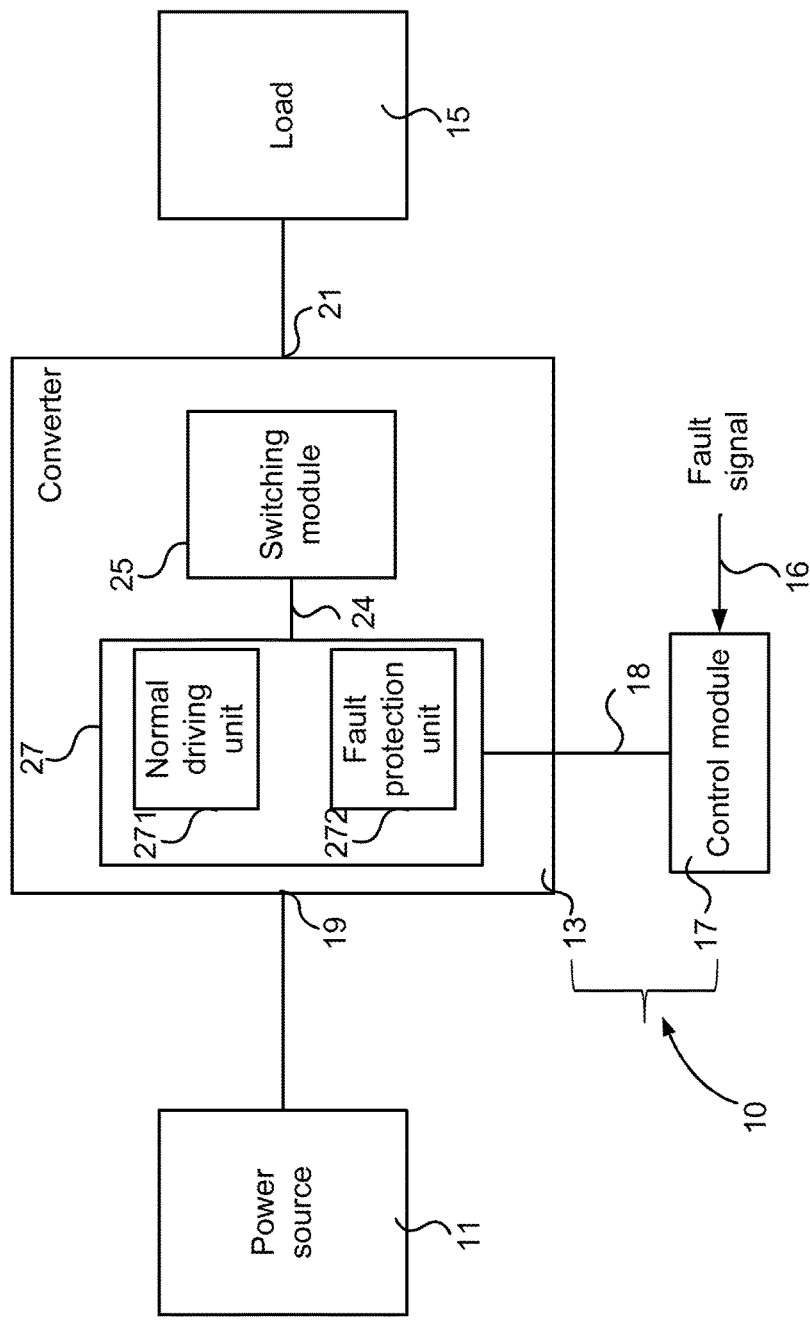
FIG. 1 is a schematic diagram of a power converting circuit in accordance with one exemplary embodiment.
Figure 11:
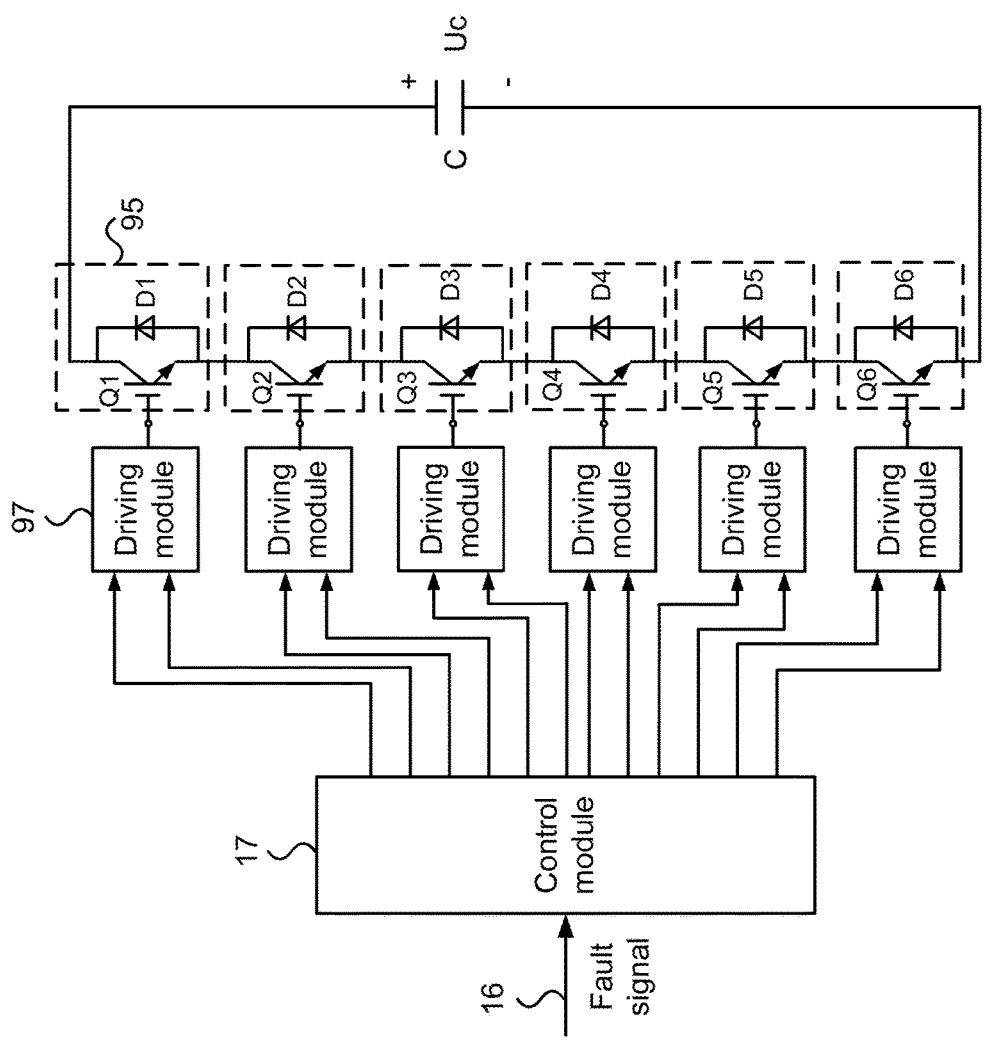
FIG. 11 is a circuit schematic diagram of six switching modules coupled in series in a switching branch in accordance with one exemplary embodiment.
Figure 14:
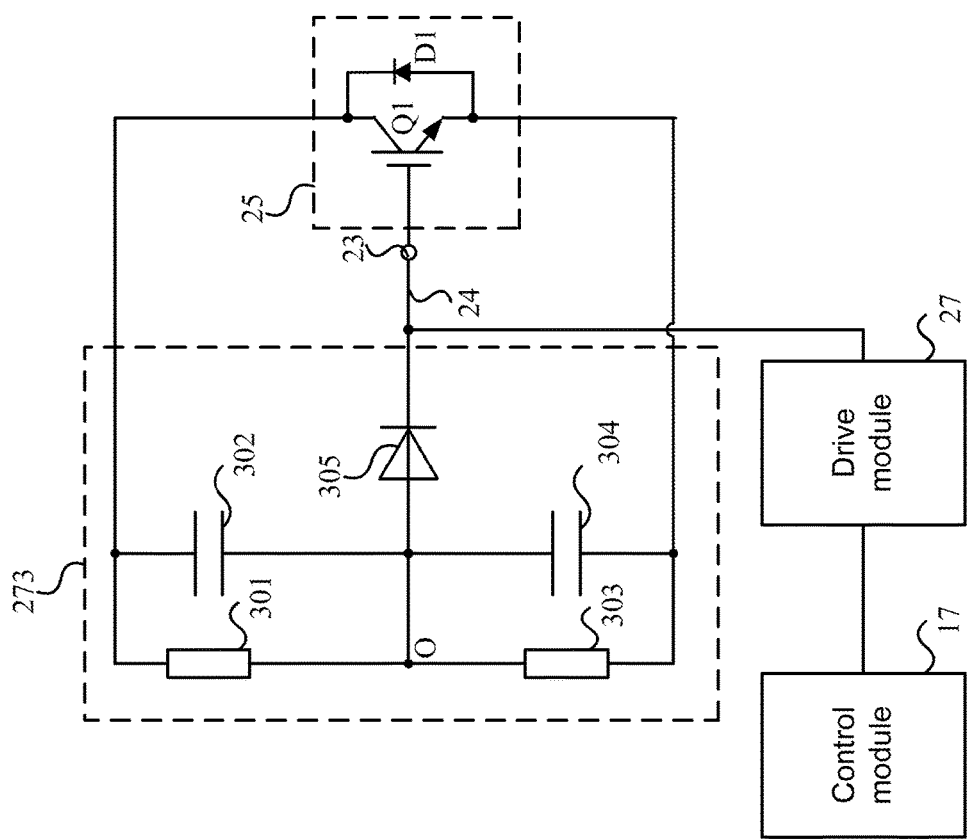
Figure 15:
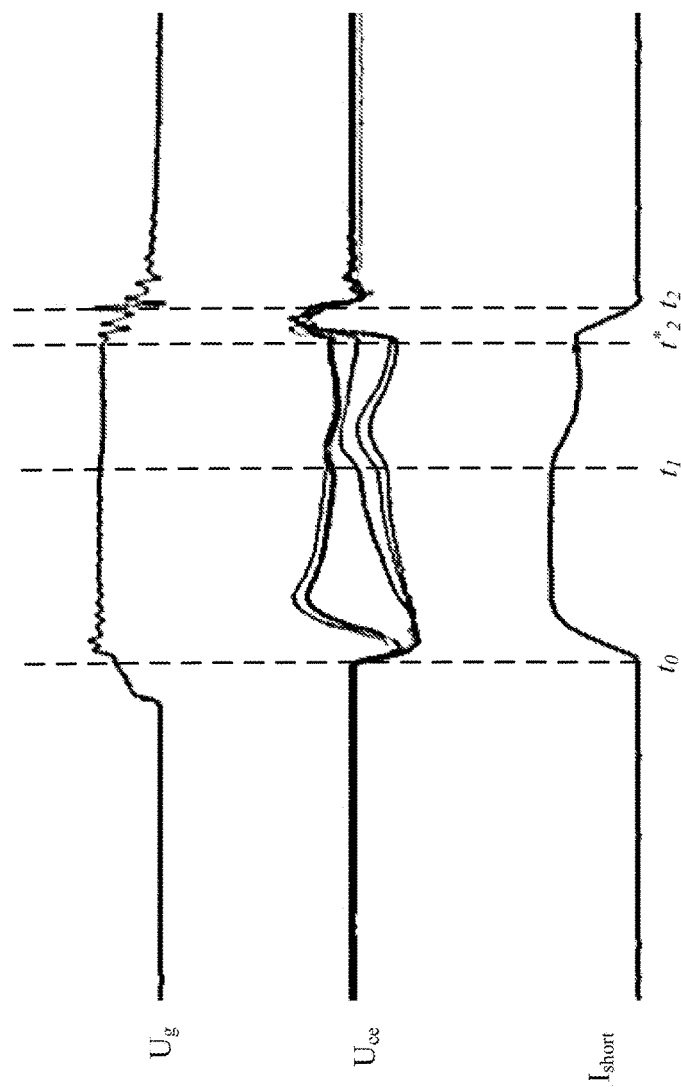

FIG. 14 is a circuit schematic diagram of a voltage balance module applied in the power converting circuit of FIG. 1 in accordance with one exemplary embodiment; and FIG. 15 is a waveform view of the switching voltage and the switching current for the six electronic switches when the voltage balance module is applied for synchronously turning off the six electronic switches of FIG. 11 in accordance with one exemplary embodiment.

DETAILED DESCRIPTION

Unless defined otherwise, technical and scientific terms used herein have the same meaning as is commonly understood by one of ordinary skill in the art to which this invention belongs. The terms "first", "second", and the like, as used herein do not denote any order, quantity, or importance, but rather are configured to distinguish one element from another. Also, the terms "a" and "an" do not denote a limitation of quantity, but rather denote the presence of at least one of the referenced items, unless otherwise noted, are merely used for convenience of description, and are not limited to any one position or spatial orientation.

Referring to FIG. 1, a schematic diagram of a power converting circuit 10 in accordance with one exemplary embodiment is shown. As an example, the power converting circuit 10 includes a power source 11, a converter 13, a load 15 and a control module 17. The control module 17 is configured to output a control command 18 to control the converter 13 for converting a first power generated by the power source 11 into a second power for providing to the load 15. The power converting circuit 10 further includes some elements not shown in FIG. 1, for instance, a fault detection unit. Only a simplified schematic view of the power converting circuit 10 is shown herein for illustrative purpose.

In some embodiments, an AC power device capable of providing an AC power, such as an AC power grid and a power generation device (e.g., a wind turbine generator) may be used as the power source 11. In some embodiments, a DC power device capable of being operated on a DC power such as a DC motor, a battery, and an ultra-capacitor, may be used as the load 15. The power converting circuit 10 may act as a rectifier for rectifying an input AC power provided by the power source 11 and providing an output DC power to the DC load 15.

In some embodiments, a DC power device capable of providing a DC power such as a solar panel, a battery, and an ultra-capacitor may be used as the power source 11. In some embodiments, an AC power device capable of being operated on an AC power such as an AC motor and an AC power grid may be used as the load 15. The power converting circuit 10 may act as an inverter for converting an input DC power provided by the power source 11 into an output AC power for driving the AC load 15.

In some embodiments, a DC power device capable of providing a DC power such as a solar panel, a battery, and an ultra-capacitor may be used as the power source 11. In some embodiments, a DC power device capable of being operated on a DC power such as a DC motor may be used as the load 15. The power converting circuit 10 may act as a DC/DC converter for converting an input DC power provided by the power source 11 into an output DC power for providing to the DC load 15.

In some embodiments, an AC power device capable of providing an AC power such as an AC power grid and a power generation device (e.g., wind turbine generator) may be used as the power source 11. In some embodiments, an AC power device capable of being operated on an AC power may be used as the load 15. The power converting circuit 10 may act as an AC/AC converter for converting an input AC power provided by the power source 11 into an output AC power for providing to the AC load 15.

In some embodiments, the control module 17 may include any suitable programmable circuits or devices such as a digital signal processor (DSP), a field programmable gate array (FPGA), a programmable logic controller (PLC), and an application specific integrated circuit (ASIC). In some embodiments, the control module 17 may be implemented in the form of hardware, software, or a combination of hardware and software.

The converter 13 includes at least one switching module 25 and a driving module 27 electrically coupled with the switching module 25. In other embodiments, the switching module 25 and the driving module 27 can be used in any other circuits that need a control the switching module, for instance, a ballast circuit of a fluorescent lighting.

When the power converting circuit 10 is operated in a fault status (e.g., short circuit fault), the switching module 25 should be turned off to avoid being destroyed by high current. In order to prevent the switching module 25 from being damaged by a high turn-off voltage caused from a quick change of current (di/dt), the driving module 27 can be configured to provide a driving signal 24 to the switching module 25 to turn off the switching module 25 in a safe way.

When the power converting circuit 10 is operated in a normal status, the control module 17 is configured to provide a first command signal to the driving module 27, and the driving module 27 is configured to output the driving signal 24 to operate the switching module 25 in a normal status. Based on the first command signal, the switching module 25 can be turned on and off normally.

When the power converting circuit 10 is operated in the fault status (e.g., short circuit fault), a short circuit current flows through the switching module 25. The control module 17 is configured to provide a second command signal to the driving module 27. After the control module 17 receives a fault signal 16, the driving module 27 is used for lowering the driving signal 24 from a driving value to a pre-determined protection value during a pre-determined fault protection period. Then, the current flowing through the switching module 25 will be lowered to a safe current value with a decrease of the driving signal 24. Herein the value of the safe current is less than the short circuit current value.

After the fault protection period, the driving module 27 is for providing a driving signal 24 having a breaking value to the switching module 25 so that the switching module 25 can be turned off under the safe current value. The current change rate (di/dt) of a decrease from the safe current value to zero is lower than the current change rate of a decrease from the short circuit current value to zero when turning off the switching module 25. Thus, the switching module 25 can bear a corresponding lower turn-off voltage and the switching module 25 can be turned off safely.

More specifically, the driving module 27 includes a normal driving unit 271 and a fault protection unit 272 as shown in FIG. 1. The normal driving unit 271 is configured to provide the driving signal 24 with a driving value according to the first command signal to turn on the switching module 25, and provide the driving signal 24 having the breaking value to turn off the switching module 25. The fault protection unit 272 is configured to lower the value of the driving signal 24 from the driving value to the protecting value according to the second command signal.

Figure 2:
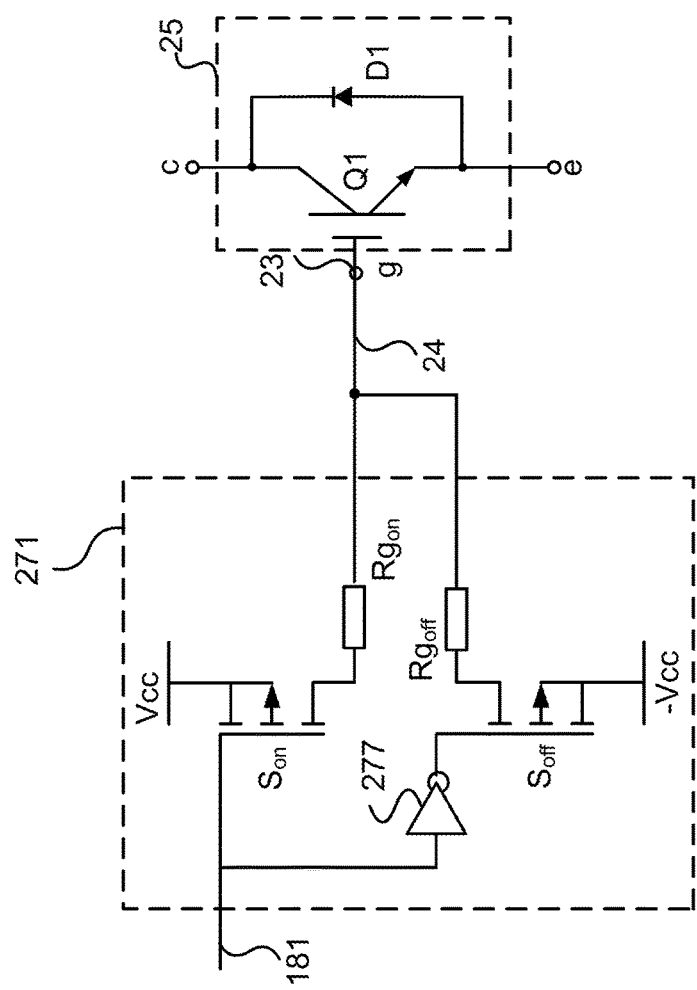
FIG. 2 is a circuit schematic diagram of a normal driving unit and a switching module of the power converting circuit of FIG. 1 in accordance with one exemplary embodiment.

Referring to FIG. 2, a circuit schematic diagram of a normal driving unit 271 and a switching module 25 of the power converting circuit 10 of FIG. 1 in accordance with one exemplary embodiment is shown. In this embodiment, the switching module 25 includes an electronic switch Q1 (e.g., Insulated Gate Bipolar Transistor, IGBT). In another embodiment, the electronic switch Q1 may include any other types of switch such as giant transistor (GTR). The type of the electronic switch Q1 can be adjusted according to the requirements and not limited to the embodiments herein.

In this embodiment, the normal driving unit 271 includes a turn-on branch for turning on the electronic switch Q1 and a turn-off branch for turning off the electronic switch Q1. In this embodiment, the turn-on branch includes an electronic switch $S_{on}$ and an on-resistance $Rg_{on}$, and the turn-off branch includes an electronic switch $S_{off}$ and an off-resistance $Rg_{off}$. A corresponding driving signal 24 is output by turning on and turning off the electronic switches $S_{on}$ and $S_{off}$ based on the first command signal 181 provided by the control module 17. In another embodiment, the normal driving unit 271 can be adjusted according to the requirements and not limited to the embodiments herein.

Typically, a complementary control of the electronic switches $S_{on}$ and $S_{off}$ is implemented. When the first command signal 181 with a turn-on value is provided, the electronic switch $S_{on}$ is turned on and the electronic switch $S_{off}$ is turned off. The normal driving unit 271 outputs the driving signal 24 having a driving value to the electronic switch Q1 to turn on the electronic switch Q1. When the first command signal 181 having a turn-off value is provided, the electronic switch $S_{on}$ is turned off and the electronic switch $S_{off}$ is turned on. The normal driving unit 271 outputs the driving signal 24 having a breaking value to the electronic switch Q1 to turn off the electronic switch Q1.

In this embodiment, the turn-off branch includes a negation component 277 electrically coupled to a drive terminal of the electronic switch $S_{off}$. When the first command signal 181 having a turn-on value is provided, the electronic switch $S_{off}$ receives a command signal having a turn-off value. When the first command signal 181 with a turn-off value is provided, the electronic switch $S_{off}$ receives a command signal having a turn-on value.

Typically, when the electronic switch Q1 is a voltage driven switch such as IGBT, the driving signal 24 is a voltage signal. When the first command signal 181 having a turn-on value is provided, the electronic switch $S_{on}$ is turned on and the driving signal 24 is at a driving voltage value VCC (e.g., 15V). When the first command signal 181 having a turn-off value is provided, the electronic switch $S_{off}$ is turned on and the driving signal 24 is at a block voltage value –VCC (e.g., –15V). In other embodiments, the type of the driving signal 24 can be adjusted according to the requirements of the electronic switch Q1 and not limited to the embodiments herein.

Figure 3:
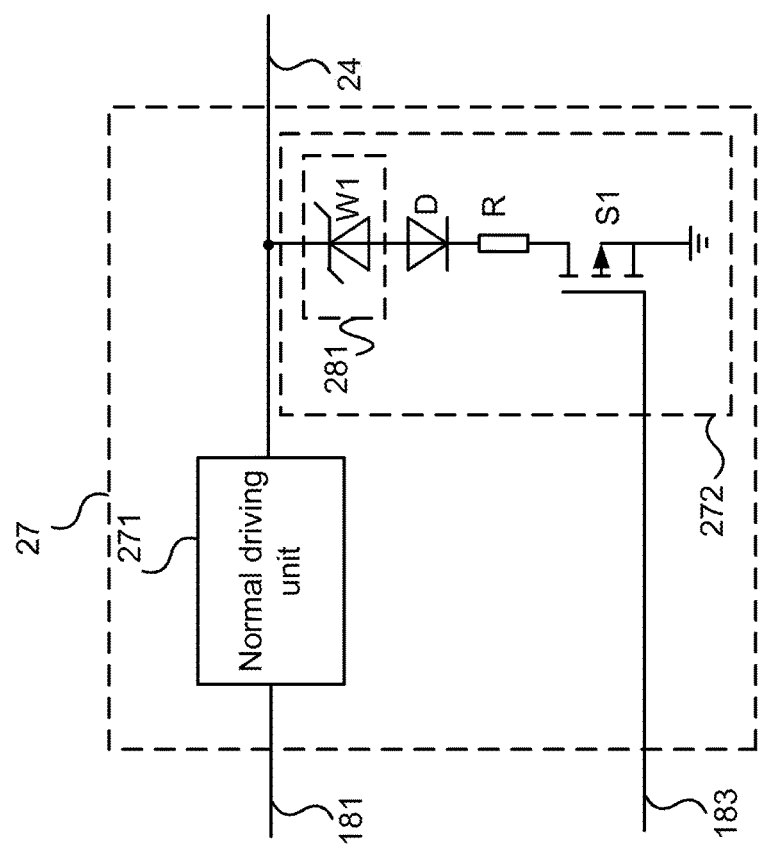
FIG. 3 is a circuit schematic diagram of a driving module of the power converting circuit of FIG. 1 in accordance with one exemplary embodiment.

Referring to FIG. 3, a circuit schematic diagram of a driving module 27 of the power converting circuit 10 of FIG. 1 in accordance with one exemplary embodiment is shown. In this embodiment, the normal driving unit 271 is in the form of the circuit as shown in FIG. 2. In other embodiments, the normal driving unit 271 is in the form of other circuits with different circuit structures.

In this embodiment, the fault protection unit 272 includes a voltage stabilizing element 281 electrically coupled to a gate 23 (driving terminal) of the switching module 25 for clamping a voltage of the driving signal 24 from a driving value to a protection value. In some embodiments, the voltage stabilizing element 281 includes a first zener diode W1. In this embodiment, the zener diode W1 can clamp the voltage of the driving signal 24 form the driving value to the protection value directly. The protecting value is the voltage drop of the first zener diode W1.

The fault protection unit 272 further includes a first switch S1 coupled with the voltage stabilizing element 281 for triggering the voltage-stabilizing element 281 to operate in a voltage stabilizing state according to the second command signal 183 provided by the control module 17.

In this embodiment, the fault protection unit 272 further includes a diode D electrically coupled between the voltage stabilizing element 281 and the first switch S1. An anode and a cathode of the diode D are coupled to the voltage stabilizing element 281 and the first switch S1 respectively for providing a unidirectional current path.

In this embodiment, the fault protection unit 272 further includes a resistance R electrically coupled between the voltage stabilizing element 281 and the first switch S1 for limiting the current to avoid an over current from flowing through the fault protection unit 272.

Figure 4:
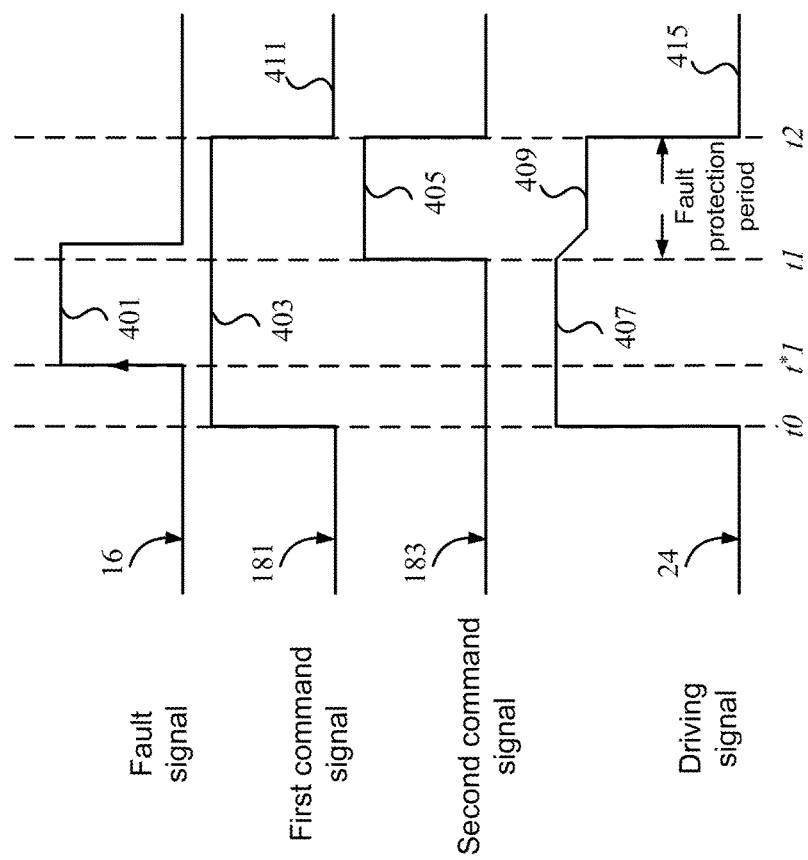
FIG. 4 is a waveform view of a control signal and a driving signal for the driving module of FIG. 3 in accordance with one exemplary embodiment.

Referring to FIG. 4, a waveform view of a control signal and a driving signal for the driving module 27 of FIG. 3 in accordance with one exemplary embodiment is shown. When the power converting circuit 10 is operated in the fault state (e.g., short current fault), the control module 17 is configured to provide the first command signal 181 and the second command signal 183 according to the fault signal 16. The driving module 27 outputs the driving signal 24 according to the first command signal 181 and the second command signal 183 to turn off the switching module 25 safely.

Wherein t0 refers to as a time point when the short circuit fault occurs. t*1 refers to as a time point when the fault signal is triggered. t1 refers to as a time point when a fault protection is enabled. t2 refers to as a time point when the switching module 25 is turned off safely. During the period from t0 to t2, a short circuit current is allowed to flow through the switching module 25. The period t2–t0 (e.g., 10 μs) can be set according to the parameters of the switching module 25. During the period from t0 to t1, the control module 17 is configured to confirm the occurrence of the short circuit fault. The period t1–t0 (e.g., 4 μs) can be set by programming in the control module. During the fault protection period from t1 to t2, the short circuit current flowed through the switching module 25 can be lowered to a safe current value and reaches a stable state. The fault protection period t2–t1 (e.g., 6 μs) can be set by programming in the control module.

During period from t0 to t2, the control module 17 is configured to provide the first command signal 181 having a turn-on value 403 to operate the switching module 25 in the turn-on state.

At the time point t*1, the fault signal 16 (e.g., a voltage signal 401 with a rising edge) can be generated by a current detection unit (not shown). During period from t0 to t1, the control module 17 is configured to receive the fault signal 16 and confirm the occurrence of short circuit fault of the power converting circuit 10. For example, a false-trigger preventing function is programmed in the control module 17 to confirm the short circuit fault. That is the false-trigger preventing function is configured to determine whether the short circuit actually occurs in the power converting circuit 10 during the period from t*1 to t1. At this time, the switching module 25 is still operated in the turn-on state according to the first command signal 181 having the turn-on value and the driving signal 24 is at a driving value 407. Only when the short circuit fault is confirmed to happen, the fault protection control will be implemented. The false-trigger preventing function can be achieved by a suitable detection program or a detection circuit and will be omitted here.

When the short circuit fault is confirmed to happen, the control module 17 is configured to provide the second command signal 183 having a turn-off value 405 to the first switch S1 to turn on the first switch S1. Then the first zener diode W1 is triggered by the turning on of the first switch S1 to operate in a clamp state. The driving signal 24 is clamped to the protection value 409. In this embodiment, the protection value 409 (e.g., 9V) is a voltage drop of the first zener diode W1.

Therefore, during the fault protection period, the fault protection unit 272 lowers the driving signal 24 from the driving value 407 to the protection value 409 according to the second command signal 183 provided by the control module 17. Correspondingly, the short circuit current flowing through the switching module 25 lowers with the decrease of the driving signal 24. After the short circuit current is lowered to a safe value and kept at the safe value until the time point t2, the control module 17 is configured to provide the first command signal 181 with a turn-off value 411 to turn off the switching module 25 and the driving signal 24 is at a breaking value 415.

Figure 5:
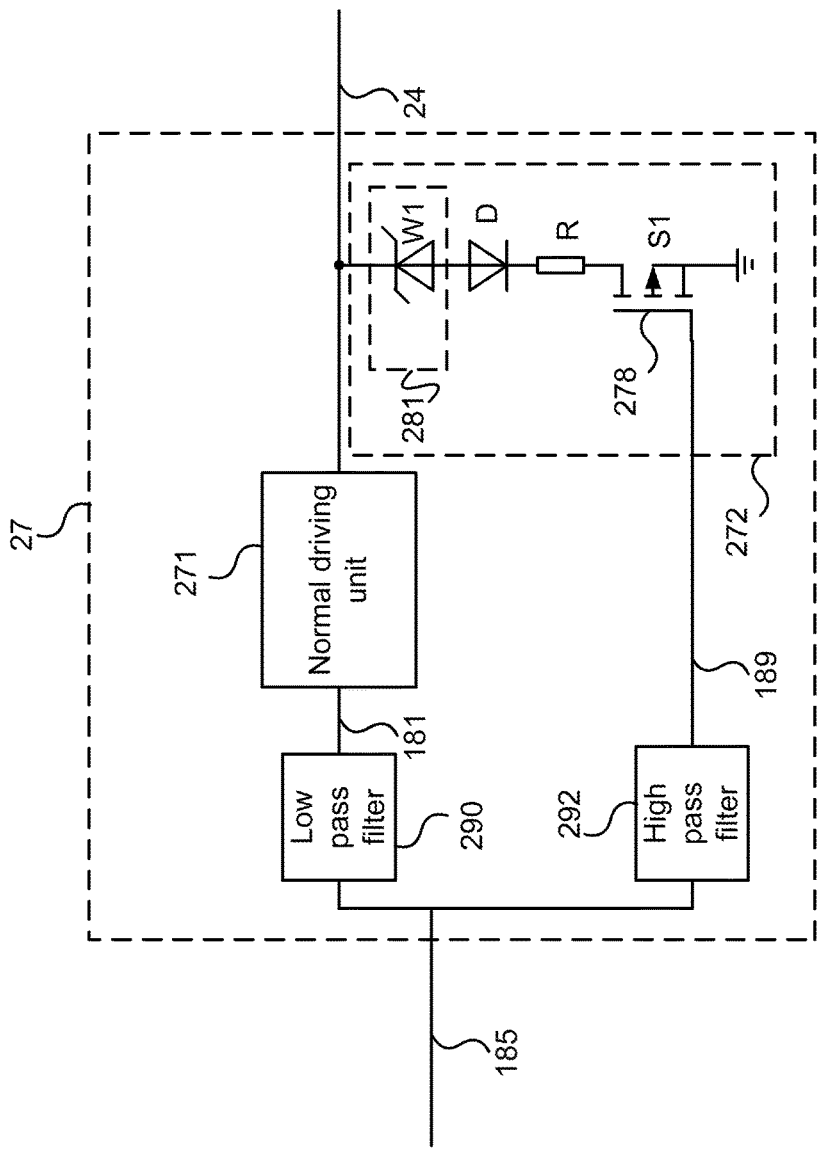
FIG. 5 is a circuit schematic diagram of the driving module of FIG. 1 in accordance with another exemplary embodiment.

Referring to FIG. 5, a circuit schematic diagram of the driving module 27 of FIG. 1 in accordance with another exemplary embodiment is shown. Similarly, the driving module 27 includes the normal driving unit 271 and the fault protection unit 272 as shown in FIG. 3. Thus, the detailed description of the normal driving unit 271 and the fault protection unit 272 is omitted here.

Compared to FIG. 3, in the embodiment of FIG. 5, the control module 17 is configured to provide a command signal 185 to the driving module 27 and the command signal 185 includes a low-frequency component signal and a high-frequency component signal. The low-frequency component signal is used as the first command signal 181 and the high-frequency component signal is used as the second command signal 183. The driving module 27 further includes a low-pass filter 290 and a high-pass filter 292. The low-pass filter 290 is electrically coupled to the normal driving unit 271 and the high-pass filter 292 is electrically coupled to the fault protection unit 272.

The low-pass filter 290 is configured to receive the command signal 185 and output the low-frequency command signal (the first command signaling signal 181) for providing to the normal driving unit 270. The high-pass filter 292 is configured to receive the command signal 185 and output the high-frequency command signal (the second command signaling signal 182) to the fault protection unit 272.

Figure 6:
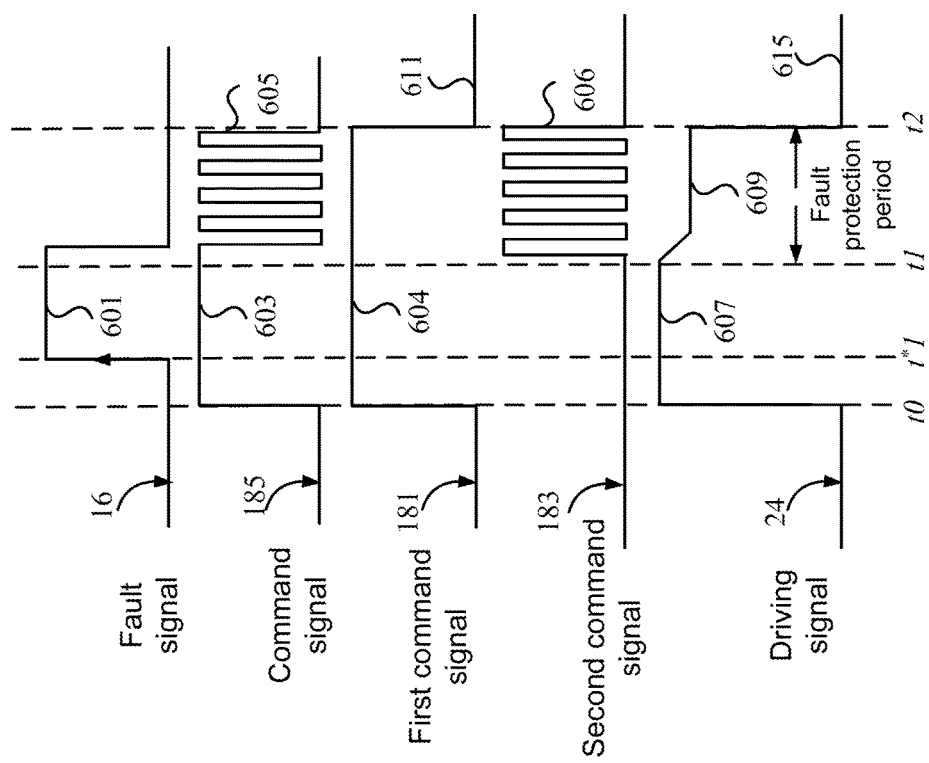
FIG. 6 is a waveform view of a control signal and a driving signal for the driving module of FIG. 5 in accordance with one exemplary embodiment.

Referring to FIG. 6, a waveform view of a control signal and a driving signal for the driving module 27 of FIG. 5 in accordance with one exemplary embodiment is shown. As shown in FIG. 6, the control module 17 is configured to output the command signal 185 to the driving module 27 based on the fault signal 16.

Wherein t0 refers to as a time point when the short circuit fault occurs. t*1 refers to as a time point when the fault signal is triggered. t1 refers to as a time point when a fault protection is enabled. t2 refers to as a time point when the switching module 25 is turned off safely. During the period from t0 to t2, a short circuit current is allowed to flow through the switching module 25. The period t2−t0 (e.g., 10 μs) can be set according to the parameters of the switching module 25. During the period from t0 to t1, the control module 17 is configured to confirm the occurrence of the short circuit fault. The period t1−t0 (e.g., 4 μs) can be set by programming in the control module. During the fault protection period t1 to t2, the short circuit current flowed through the switching module 25 can be lowered to a safe current value and reaches a stable state. The fault protection period t2−t1 (e.g., 6 μs) can be set by programming in the control module.

During period from t0 to t2, the command signal 185 includes a low-frequency driving command signal 603. During period from t1 to t2, the command signal 185 includes a high-frequency protecting command signal 605.

After the command signal 185 is provided to the low-pass filter 290 and the high-pass filter 292 as shown in FIG. 5, the low-frequency command signal 181 (the first command signal) and the high-frequency command signal 183 (the second command signal) are obtained respectively. The driving module 27 is configured to output the driving signal 24 based on the low-frequency command signal 181 and the high-frequency command signal 183 to turn off the switching module 25 safely. During period from t0 to t2, the control module 17 is configured to provide the low-frequency command signal 181 having a turn-on value 604 to operate the switching module 25 in the turn-on state.

At the time point t*1, the fault signal 16 (e.g., a voltage signal 601 with a rising edge) can be generated by a current detection unit (not shown). During period from t0 to t1, the control module 17 is configured to receive the fault signal 16 and confirm the occurrence of short circuit fault of the power converting circuit 10. For example, a false-trigger preventing function is programmed in the control module 17 to confirm the short circuit fault. That is the false-trigger preventing function is configured to determine whether short circuit actually occurs in the power converting circuit 10 during the period from t*1 to t1. At this time, the switching module 25 is still operated in the turn-on state according to the first command signal 181 having the turn-on value 604 and the driving signal 24 is at a driving value 607. Only when the short circuit fault is confirmed to happen, the fault protection control will be implemented. The false-trigger preventing function can be achieved by a suitable detection program or a detection circuit.

When the short circuit fault is confirmed to happen, a high frequency command signal 183 having a high frequency switching value 606 is provided to the first switch S1 to turn on the first switch S1. Then the first zener diode W1 is triggered by the turning on of the first switch S1 to operate in the clamp state. The driving signal 24 is clamped to the protection value 609. In this embodiment, the protection value 609 is the voltage drop of the first zener diode W1.

Therefore, during the fault protection period, the fault protection unit 272 is configured to lower the driving signal 24 from the driving value 607 to the protection value 609 according to the high frequency command signal 183 provided by the control module 17. Correspondingly, the short circuit current flowing through the switching module 25 is lowered with the decrease of the driving signal 24. After the short circuit current is lowered to a safe value and kept at the safe value until the time point t2, the control module 17 is configured to provide the low frequency command signal 181 having the turn-off value 611 to turn off the switching module 25 and the driving signal 24 is at a breaking value 615.

Figure 7:
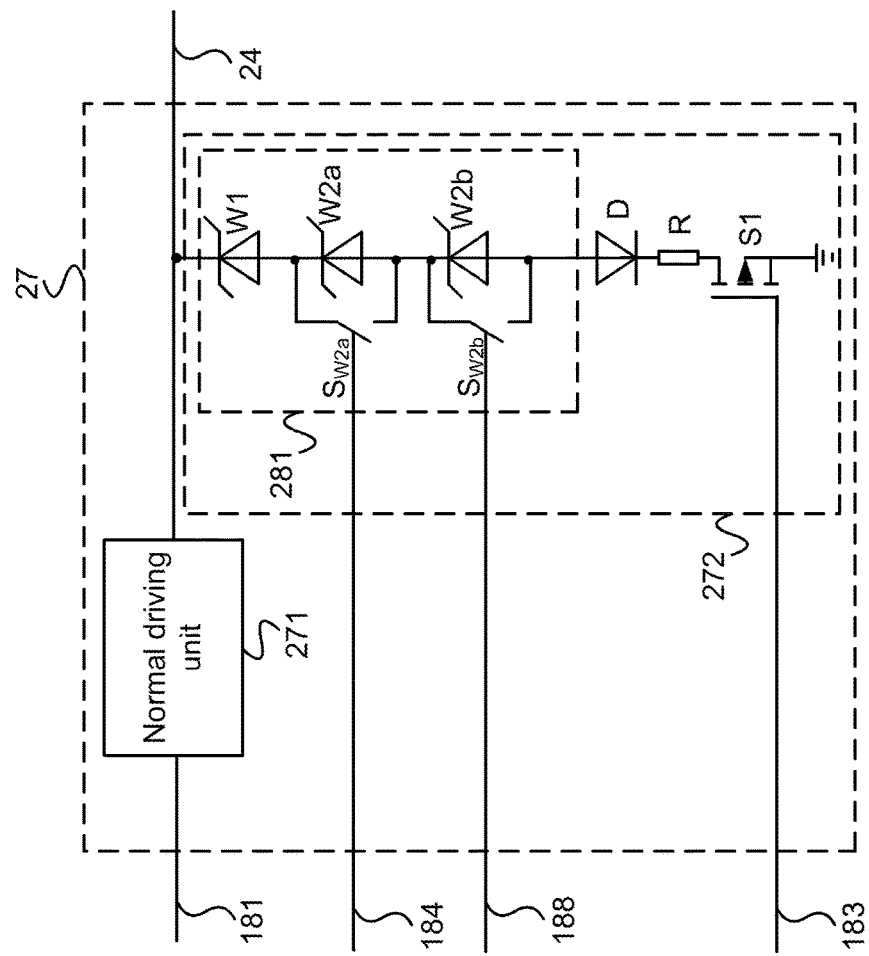
FIG. 7 is a circuit schematic diagram of the driving module of FIG. 1 in accordance with another exemplary embodiment.

Referring to FIG. 7, a circuit schematic diagram of the driving module 27 of FIG. 1 in accordance with another exemplary embodiment is shown. Compared with FIG. 3, in the embodiment of FIG. 7, the voltage-stabilizing element 281 further includes multiple second zener diodes electrically coupled with the first zener diode W1. Each of second switches is coupled with two terminals of each of the second zener diodes in parallel. The multiple second switches are configured to receive multiple third command signals provided by the control module 17 to turn on and off the second switches.

As an example, as shown in FIG. 7, the voltage stabilizing element 281 includes two second zener diodes W2a, W2b. A second switch $S_{W2a}$ is coupled with the second zener diode W2a in parallel and a second switch $S_{W2b}$ is coupled with the second zener diode W2b in parallel. The second switch $S_{W2a}$ is turned on and off according to a third command signal 184 provided by the control module 17. The second switch $S_{W2b}$ is turned on and off according to a third command signal 188 provided by the control module 17.

When the short circuit fault occurs, after the fault protecting unit 272 receives the second command signal 183 having a turn-on value, the voltage stabilizing element 281 is triggered to operate at a voltage stabilizing state. When the two second switches $S_{W2a}$, $S_{W2b}$ are turned on successively, the corresponding second zener diodes W2a and W2b are short circuited. According to the clamping function of a flexible number of the zener diode, the voltage of the driving signal 24 can be lowered from the driving value to the protection value step by step.

Figure 8:
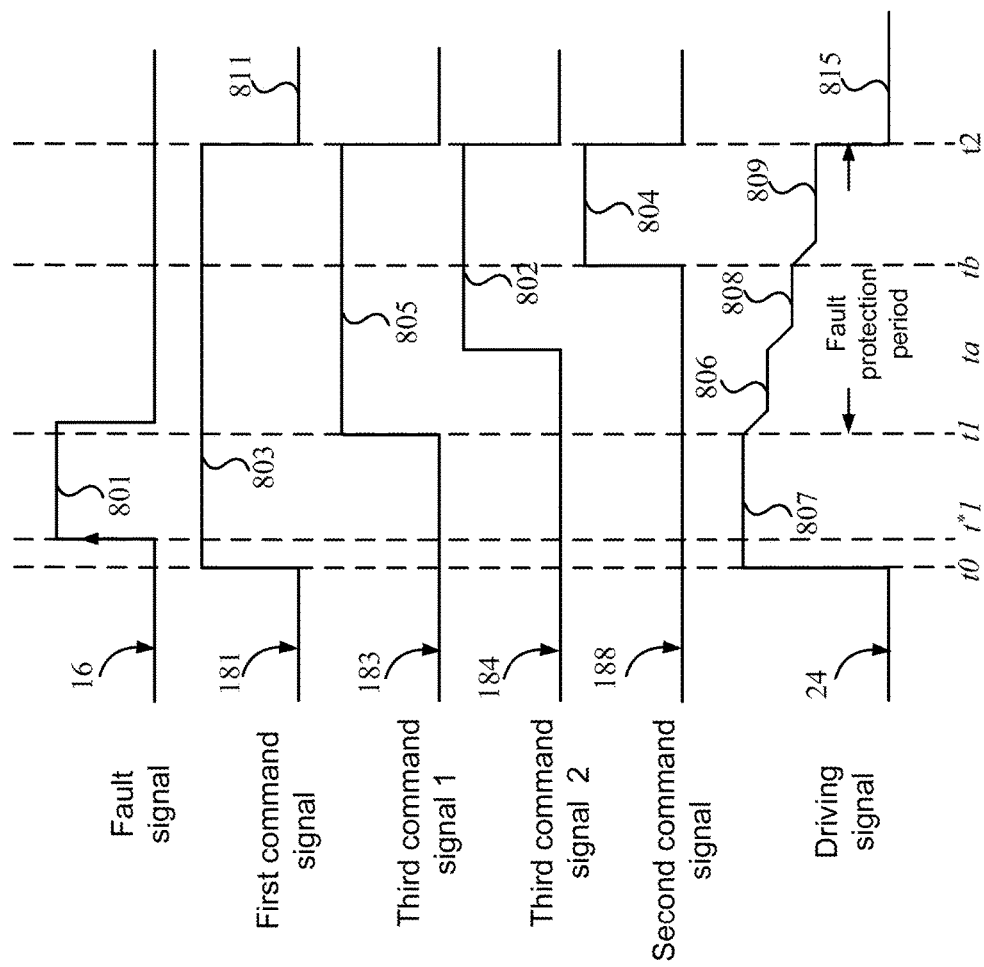
FIG. 8 is a waveform view of the control signal and the driving signal for the driving module of FIG. 7 in accordance with one exemplary embodiment.

Referring to FIG. 8, a waveform view of the control signal and the driving signal for the driving module 27 of FIG. 7 in accordance with one exemplary embodiment is shown. When the short circuit fault occurs, the control module 17 is configured to provide a first command signal 181, a second command signal 183, and two third command signals 184 and 188 according to the fault signal 16. The driving module 27 is configured to generate the driving signal 24 to turn off the switching module 25 safely based on the first command signal 181, the second command signal 183, and the two third command signals 184 and 188.

Wherein t0 refers to as a time point when the short circuit fault occurs. t*1 refers to as a time point when the fault signal is triggered. t1 refers to as a time point when a fault protection is enabled. t2 refers to as a time point when the switching module 25 is turned off safely. During the period from t0 to t2, a short circuit current is allowed to flow through the switching module 25. The period t2−t0 (e.g., 10 μs) can be set according to the parameters of the switching module 25. During the period from t0 to t1, the control module 17 is configured to confirm the occurrence of the short circuit fault. The period t1−t0 (e.g., 4 μs) can be set by programming in the control module. During the fault protection period t1 to t2, the short circuit current flowed through the switching module 25 can be lowered to a safe current value and reaches a stable state. The fault protection period t2−t1 (e.g., 6 μs) can be set by programming in the control module.

During period from t0 to t2, the control module 17 is configured to provide the first command signal 181 having a turn-on value 803 to operate the switching module in the turn-on state.

At the time point t*1, the fault signal 16 (e.g., a voltage signal 801 with a rising edge) can be generated by a current detection unit (not shown). During period t0 to t1, the control module 17 is configured to receive the fault signal 16 and confirm the occurrence of short circuit fault of the power converting circuit 10. For example, a false-trigger preventing function is programmed in the control module 17 to confirm the short circuit fault. That is the false-trigger preventing function is configured to determine whether short circuit actually occurs in the power converting circuit 10 during the period t*1 to t1. During this time, the switching module 25 is still in the turn-on state according to the first command signal 181 having the turn-on value 803 and the driving signal 24 is at a driving value 807. Only when the short circuit fault is confirmed to happen, the fault protection control will be implemented.

When the short circuit fault is confirmed to happen, the control module 17 is configured to provide the second command signal 183 having a turn-on value 805 to the first switch S1 to turn on the first switch S1. Then the first zener diode W1 and the second zener diodes W2a, W2b are triggered by the turning on of the first switch S1 to operate in the clamp state. The driving signal 24 is clamped to a protection value 806. In this embodiment, the protection value 806 is the summation of each voltage drop of the first zener diode W2 and the second zener diodes W2a, W2b.

During period from ta to t2, the control module 17 is configured to provide the third command signal 184 with a turn-on value 802 to the second switch $S_{W2a}$ so that the second zener diode W2a is short circuited. During period from ta to tb, the driving signal 24 is clamped to a protection value 808. In this embodiment, the protection value 808 is the summation of each voltage drop of the first zener diode W1 and the second zener diode W2b.

During period from tb to t2, the control module 17 is configured to provide the third command signal 188 having a turn-on value 804 to the second switch $S_{W2a}$ so that the second zener diode W2b is short circuited. During period from tb to t2, the driving signal 24 is clamped to a protection value 809. In this embodiment, the protection value 809 is a voltage drop of the first zener diode W1.

Therefore, during the fault protection period, the fault protection unit 272 is configured to lower the driving signal 24 from the driving value 807 to the protection values 806, 807 and then to the protection value 809 step by step. Correspondingly, the short circuit current flowing through the switching module 25 lowers gradually with the gradual decrease of the driving signal 24. Therefore, it is advantageous at an avoidance of a damage to the switching module 25 caused by an overvoltage due to a quick change of the short circuit current when the driving signal 24 is lowered form the driving value 807 to the protection value 809 directly. After the short circuit current is lowered to a safe value and kept at the safe value until the time point t2, the control module 17 is configured to provide the first command signal 181 having the turn-off value 811 to turn off the switching module 25 and the driving signal 24 is at the breaking value 815.

Figure 9:
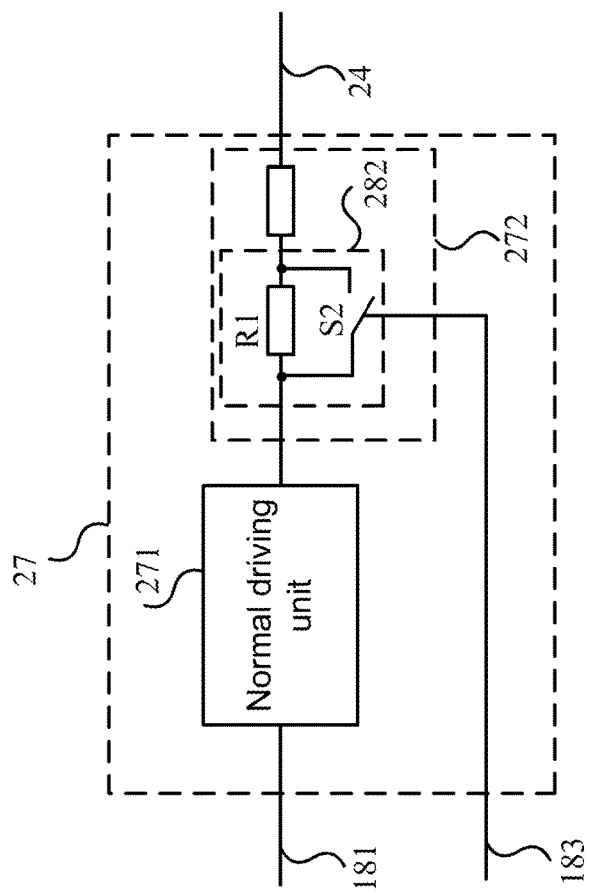
FIG. 9 is a circuit schematic diagram of the driving module of FIG. 1 in accordance with another exemplary embodiment.

Referring to FIG. 9, a circuit schematic diagram of the driving module 27 of FIG. 1 in accordance with another exemplary embodiment is shown. In this embodiment, the circuit as shown in FIG. 2 can be used as the normal driving unit 271. In other embodiments, other driving circuits with different structures can be used as the normal driving unit 271.

In this embodiment, the fault protection unit 272 includes a variable impedance element 282 electrically coupled with a gate 23 (the driving terminal) of the switching module 25 and the normal driving unit 271 for lowering a voltage of the driving signal 24 from the driving value to the protecting value. In some embodiments, the variable impedance element 282 includes a resistance R1 and controllable switch S2. The controllable switch S2 is electrically coupled with two terminals of the resistance R1 in parallel. In another embodiment, the resistance R1 includes multiple resistances coupled in series.

In this embodiment, after the fault occurs, the controllable switch S2 is turned off according to the second command signal 183. The resistance R1 has a voltage dividing function for lowering the voltage of the driving signal 24 from the driving value to the protecting value.

In another embodiment, the variable impedance element 282 can be in a form of a switch controlled by the command or a variable impedance chip controlled by the command.

Figure 10:
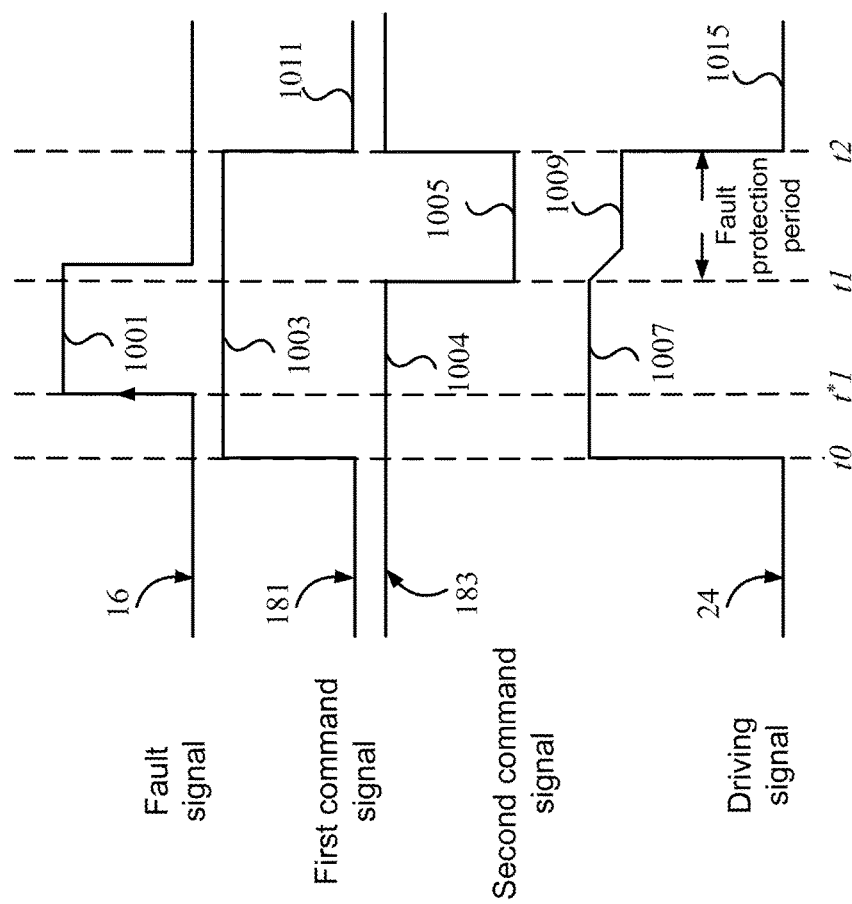
FIG. 10 is a waveform view of the control signal and the driving signal for the driving module of FIG. 9 in accordance with one exemplary embodiment.

Referring to FIG. 10, a waveform view of the control signal and the driving signal for the driving module 27 of FIG. 9 in accordance with one exemplary embodiment is shown. When the fault occurs (e.g., short circuit fault), the control module 17 is configured to output the first command signal 181 and the second command signal 183 based on the fault signal 16. The driving module 27 is configured to output the driving signal 24 based on the first command signal 181 and the second command signal 183 to turn off the switching module 25 safely.

Wherein t0 refers to as a time point when the short circuit fault occurs. t*1 refers to as a time point when the fault signal is triggered. t1 refers to as a time point when a fault protection is enabled. t2 refers to as a time point when the switching module 25 is turned off safely. During the period from t0 to t2, the short circuit current is allowed to flow through the switching module 25. The period t2–t0 (e.g., 10 μs) can be set according to the parameters of the switching module 25. During the period from t0 to t1, the control module 17 is configured to confirm the occurrence of the short circuit fault. The period t1–t0 (e.g., 4 μs) can be set by programming in the control module. During the fault protection period from t1 to t2, a short circuit current flowed through the switching module 25 can be lowered to a safe current value and reaches a stable state. The fault protection period t2–t1 (e.g., 6 μs) can be set by programming in the control module.

During period t0 to t2, the control module 17 is configured to provide the first command signal 181 having a turn-on value 1003 to operate the switching module 25 in the turn-on state.

At the time point t*1, the fault signal 16 (e.g., a voltage signal 1001 with a rising edge) can be generated by a current detection unit (not shown). During period from t0 to t1, the control module 17 is configured to receive the fault signal 16 and confirm the occurrence of short circuit fault in the power converting circuit 10. For example, a false-trigger preventing function is programmed in the control module 17 to confirm the short circuit fault. That is the false-trigger preventing function is configured to determine whether the short circuit fault actually occurs in the power converting circuit 10 during the period from t*1 to t1. At this time, the switching module 25 is still operated in the turn-on state according to the first command signal 181 with the turn-on value 1003. The controllable switch S2 is operated in the turn-on state according to the second command signal 183 having the turn-on value 1004. The resistance R1 is short circuited, the resistance of the variable impedance element 282 is zero, and the driving signal 24 is at a driving value 1007. Only when the short circuit fault is confirmed to happen, the fault protection control will be implemented.

When the short circuit fault is confirmed to happen, the control module 17 is configured to provide the second command signal 183 having a turn-off value 1005 to the controllable switch S2 to turn off the controllable switch S2. The resistance R1 has the voltage dividing function with the turning off of the controllable switch S2. In this embodiment, the driving signal 24 is lowered to the protection value 1009.

Therefore, during the fault protection period, the fault protection unit 272 is configured to lower the driving signal 24 from the driving value 1007 to the protection value 1009 according to the second command signal 183 provided by the control module 17. Correspondingly, a short circuit current flowing through the switching module 25 lowers with the decrease of the driving signal 24. After the short circuit current is lowered to a safe value and kept at the safe value until the time point t2, the control module 17 is configured to provide the first command signal 181 having the turn-off value 1011 to turn off the switching module 25 and the driving signal 24 is at a breaking value 1015.

Referring to FIG. 11, a circuit schematic diagram of six switching modules coupled in series in a switching branch in accordance with one exemplary embodiment is shown. When a high voltage and/or a high power flows through the power converting circuit 10, each switching module bears a high voltage. To prevent the switching module from being damaged by the high voltage, it is necessary to couple multiple switching modules in series in each switching branch (e.g., six IGBTs are coupled in series in one switch branch) to share the high voltage together. That is, each electronic switch only needs to bear a corresponding low voltage so that each electronic switch can be prevented from being damaged. The quantity and type of the electronic switch can be adjusted according to the actual request. For instance, more switches are employed to couple in series in one switching branch when an input voltage of the switch branch is too high.

Besides, the electronic switches coupled in series are turned on and off simultaneously when controlling each switching module 95. Each driving module 97 is electrically coupled with one switching module 95. Each switching module 97 as shown in FIG. 11 includes the normal driving unit 271 and the fault protection unit 272 as shown in FIG. 1. The driving module 97 is configured to provide the command signals simultaneously to the driving modules 97 for turning on and off the switching modules 25 simultaneously.

Figure 12:
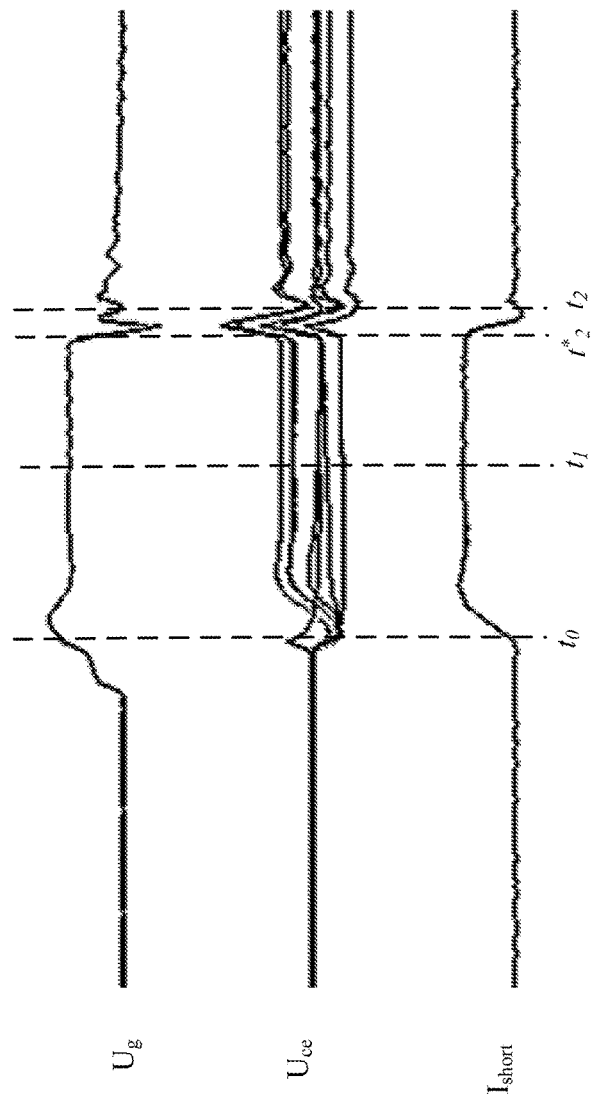
FIG. 12 is a waveform view of a switching voltage and a switching current when six electronic switches of FIG. 11 are synchronously turned off without enabling a fault protection unit during short circuit fault in accordance with one exemplary embodiment.

Referring to FIG. 12, a waveform view of a switching voltage and a switching current when six electronic switches of FIG. 11 were synchronously turned off without enabling a fault protection unit during short circuit fault in accordance with one exemplary embodiment is shown. A driving voltage waveform $U_g$, a voltage waveform $U_{ce}$ of two terminals of each of the six switching modules coupled in series and a short circuit current $I_{short}$ in the switching branch are shown in FIG. 12. In FIG. 12, t0 refers to as a time point when the short circuit fault occurs. During the period from t0 to t1, a short circuit fault is confirmed to happen. Period t*2 to t2 is a dynamic response time of the turn-off voltage of each switching module 95 generated when turning off the switch branch.

During period from t1 to t2, the fault protection unit 272 is not enabled. The driving signal Ug is still kept at the driving value thereof, and the short circuit current $I_{short}$ stays at the same value. During period from t*2 to t2, the six switching modules 95 connected in series are turned off. As shown in FIG. 12, a comparatively high turn-off voltage $U_{ce}$ is generated at two terminals of each switching module 95 due to a decrease of the short circuit current form the short circuit current value to 0.

Figure 13:
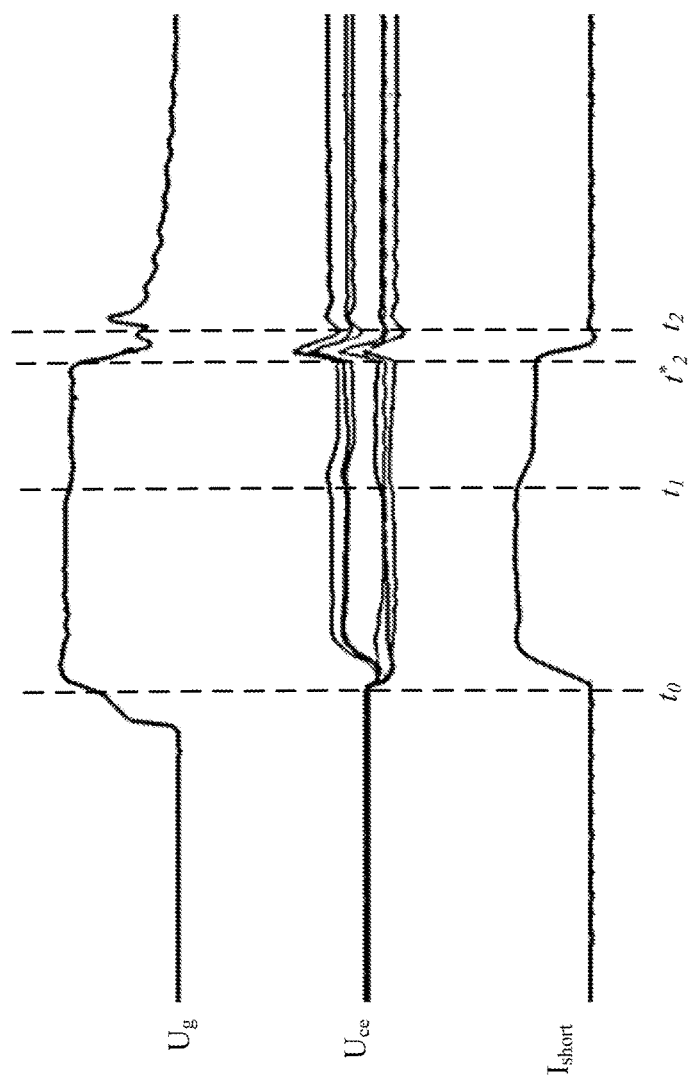
FIG. 13 is a waveform view of the switching voltage and the switching current when the six electronic switches of FIG. 11 are synchronously turned off with enabling a fault protection unit during short circuit fault in accordance with one exemplary embodiment.

Referring to FIG. 13, a waveform view of the switching voltage and the switching current when the six electronic switches of FIG. 11 are synchronously turned off with enabling a fault protection unit during short circuit fault in accordance with one exemplary embodiment is shown. Compared with FIG. 12, in the embodiment of FIG. 13, during period from t1 to t2, the fault protection unit 272 is enabled, the driving signal $U_g$ is lowered from the driving value to the protecting value, and the short circuit current $I_{short}$ is lowered to a safe current value. During period t*2 to t2, the six switching modules 95 coupled in series are turned off. As shown in FIG. 13, the turn-off voltage $U_{ce}$ of each switching module 95 is lower than that in FIG. 12 due to a decrease of the short circuit current from the safe current value to 0.

Although the decrease of the turn-off voltage $U_{ce}$ generated at two terminals of the switching module 95 can satisfy the request of being turned off safely, it can be seen from the turn-off voltage waveform in FIG. 12 and FIG. 13, during period from t*2 to t2, a voltage imbalance problem may exist among the voltages of each switching module when turning off the six switching modules simultaneously.

Referring to FIG. 14, a circuit diagram of a voltage balance module applied in the power converting circuit of FIG. 1 in accordance with one exemplary embodiment is shown. As shown in FIG. 14, each switching module 25 is coupled with a driving module 27. Only one switching module 25 and its corresponding circuit are shown here. Other adjacent switching modules 25 and their corresponding circuits are the same so detailed description is omitted here. The switching module 25 is further coupled with a corresponding voltage balance module 273. When the short circuit fault occurs, a specific embodiment about how to turn off each switching module 25 safely will be illustrated below.

Firstly, the driving module 25 receives the second command signal 183 provided by the control module 17 to lower the driving signal 24 provided to the switching module 25, so that the short circuit current can be lowered to a safe current value. Then, during the process of turning off the switching module 25, the switching module 25 with the largest voltage on its two terminals will inject the driving current to its gate (driving terminal) via a unidirectional element. After injecting the driving current, the switching module 25 is operated in the line region. Thus, the voltage between the two terminals of the switching module 25 is lowered due to the turning on of the switching module 25. Finally, dynamic voltage balance can be achieved among the multiple switching modules 25.

As an example, the voltage balance module 273 includes a first resistance 301, a first capacitance 302, a second resistance 303, a second capacitance 304 and a diode 305. First terminals of the resistance 301, the first capacitor 302, the second resistance 303, and the second capacitor 304 are electrically coupled with an anode of the diode 305 at a point O. Second terminals of the first resistance 301 and the first capacitor 302 are electrically coupled with a collector (a first terminal) of the switching module 25. Second terminals of the second residence 303 and the second capacitor 304 are electrically coupled with an emitter (a second terminal) of the switching module 25. A cathode of the diode 305 is electrically coupled to the gate 23 of the switching module 25. In this embodiment, capacity of the first capacitor 302 is larger than that of the second capacitor 304.

Considering the characteristics of IGBT and the accuracy of the control system, one switching module will be turned off before other switching modules are all turned off when controlling one switching branch having at least two switching modules coupled in series synchronously. Therefore, a voltage imbalance problem will be caused due to a quick turning off of one switching module.

When the short circuit fault occurs, the switching module 25 which bears the highest voltage in the switching branch compared to the other switching modules is injected with a current via the diode 305 of the voltage balance module 273 which is coupled with the switching module 25. The corresponding switching module 25 can be operated in the line region. The switching module 25 which is turned off in advance will be then turned on and voltage balance can be achieved in the switching branch.

In other embodiments, a voltage imbalance problem can also happen when one switching module is turned on with a delay compared with other switching modules in the switching branch. A balance voltage control can be achieved by using the voltage balance module 273. In other embodiments, the voltage balance module 273 can be in a form of other circuits such as a RC absorbing circuit.

Referring to FIG. 15, a waveform view of the switching voltage and the switching current for the six electronic switches when the voltage balance module 273 is applied for synchronously turning off the six electronic switches of FIG. 11 in accordance with one exemplary embodiment is shown. Compared with FIG. 11, in the embodiment of FIG. 15, during period from t*2 to t2, the six switching modules coupled in series can be turned off with an approximately the same turn-off voltage Uce for each switching module. Therefore, voltage balance is achieved with the use of the voltage balance module 273.

It is to be understood that a skilled artisan will recognize the interchangeability of various features from different embodiments and that the various features described, as well as other known equivalents for each feature, may be mixed and matched by one of ordinary skill in this art to construct additional systems and techniques in accordance with principles of this disclosure. It is, therefore, to be understood that the appended claims are intended to cover all such modifications and changes as fall within the true spirit of the invention.

Further, as will be understood by those familiar with the art, the present invention may be embodied in other specific forms without depending from the spirit or essential characteristics thereof. Accordingly, the disclosures and descriptions herein are intended to be illustrative, but not limiting, of the scope of the invention which is set forth in the following claims.

What is claimed is:

1. A circuit comprising:
 a plurality of switching modules;
 a control module;
 a driving module electrically coupled between the control module and a corresponding one of the switching modules for generating a driving signal, the driving module comprising:
  a normal driving unit for turning on and off the corresponding switching module according to a first command signal from the control module; and
  a fault protection unit for lowering the driving signal from a driving value to a protection value according to a second command signal from the control module during a fault protection period after the control module receives a fault signal, and a voltage balance module electrically coupled to the switching modules for injecting a current to a drive terminal of the switching module to balance voltage among the switching modules, the voltage balance module including a first resistance, a first capacitor, a second resistance, a second capacitor, and a diode, wherein:
first terminals of the first resistance, the first capacitor, the second resistance, and the second capacitor are electrically coupled with an anode of the diode;
second terminals of the first resistance and the first capacitor are electrically coupled with a collector of the switching module;
second terminals of the second resistance and the second capacitor are electrically coupled with an emitter of the switching module; and
a cathode of the diode is electrically coupled to a gate of the switching module.

2. The circuit of claim 1, wherein the normal driving unit is further for providing the driving signal having a breaking value to the switching module to turn off the switching modules after the fault protection period, and the protection value is greater than the breaking value.

3. The circuit of claim 2, wherein the first command signal comprises a low-frequency component signal, the second command signal comprises a high-frequency component signal, the first command signal and the second command signal are combined as one command signal provided by the control module.

4. The circuit of claim 1, wherein the fault protection unit comprises a voltage stabilizing element for clamping the driving signal from the driving value to the protection value.

5. The circuit of claim 4, wherein the fault protection unit further comprises a first switch for triggering the voltage stabilizing element to operate in a voltage stabilizing state according to the second command signal from the control module.

6. The circuit of claim 5, wherein the voltage stabilizing element comprises a first zener diode electrically coupled between the switching modules and the first switch.

7. The circuit of claim 6, wherein the driving signal is lowered step by step from the driving value to the protection value.

8. The circuit of claim 7, wherein the voltage stabilizing element comprises:
a plurality of second zener diodes electrically coupled to the first zener diode in series; and
a plurality of second switches, wherein each second switch is electrically coupled between two terminals of each second zener diode; and
wherein after the first switch is triggered to be operated in a turn-on state according to the second command signal, the plurality of second switches are successively turned on according to third command signals provided by the control module.

9. The circuit of claim 1, wherein the fault protection unit comprises a variable impedance element electrically coupled between the switching modules and the normal driving unit for lowering the driving signal from the driving value to the protection value.

10. The circuit of claim 9, wherein the variable impedance element comprises a resistance and a controllable switch electrically coupled with two terminals of the resistance, and the controllable switch is turned off when receiving the second command signal.

11. A power conversion circuit, comprising:
a control module;
a converter electrically coupled to the control module for converting a first power to a second power, and wherein the converter comprises:
a plurality of switching modules;
a driving module electrically coupled between the control module and a corresponding one of the switching modules for generating a driving signal, the driving module comprising:
a normal driving unit for turning on and off the corresponding switching module according to a first command signal from the control module;
a fault protection unit for lowering the driving signal from a driving value to a protection value according to a second command signal from the control module during a fault protection period after the control module receives a fault signal, and
a voltage balance module electrically coupled to the switching modules for injecting a current to a drive terminal of the switching module to balance voltage among the switching modules, the voltage balance module including a first resistance, a first capacitor, a second resistance, a second capacitor, and a diode,
wherein first terminals of the first capacitor, the first resistance, the second capacitor, and the second resistance are electrically coupled with an anode of the diode; wherein second terminals of the first resistance and the first capacitor are electrically coupled with a collector of the switching module; wherein second terminals of the second resistance the second capacitor are electrically coupled with an emitter of the switching; and a cathode of the diode is electrically coupled to a gate of the switching module.

12. The power conversion circuit of claim 11, wherein the normal driving unit is further for providing the driving signal having a breaking value to the switching modules to turn off the switching modules after the fault protection period, and the protection value is greater than the breaking value.

13. The power conversion circuit of claim 11, wherein the fault protection unit comprises a voltage stabilizing element for clamping the driving signal from the driving value to the protection value.

14. The power conversion circuit of claim 11, wherein the fault protection unit comprises a variable impedance element electrically coupled between the switching modules and the normal driving unit for lowering the driving signal from the driving value to the protection value.

15. A power conversion circuit, comprising:
a control module;
a converter electrically coupled to the control module, the converter including a plurality of switching modules and a driving module electrically coupled to a corresponding one of the switching modules, the driving module having a normal driving unit for turning on and off a corresponding switching module according to a command signal from the control module; and
a voltage balance module electrically coupled to the switching modules for injecting a current to a drive terminal of the switching module to balance voltage among the switching modules, the voltage balance module including a first resistance, a first capacitor, a second resistance, a second capacitor, and a diode,
wherein second terminals of the first capacitor and first resistance are electrically coupled with a collector of a corresponding one of the switching modules; wherein second terminals of the first resistance the first capacitor are electrically coupled with a collector of the corresponding one of the switching modules; and wherein second terminals of the second resistance and the second capacitor are electrically coupled with an emitter of the corresponding one of the switching modules.

16. The power conversion circuit of claim 15, a capacity of the first capacitor is larger than a capacity of the second capacitor.

17. The power conversion circuit of claim 15, wherein a cathode of the diode is electrically coupled with a gate of the corresponding one of the switching modules.

* * * * *